(12) United States Patent
Breinlinger

(10) Patent No.: US 7,019,318 B2
(45) Date of Patent: Mar. 28, 2006

(54) DUAL CURRENT-SOURCE DIGITAL-INPUT CIRCUIT FOR AN INDUSTRIAL AUTOMATION SYSTEM

(75) Inventor: Richard H. Breinlinger, Hampstead, NH (US)

(73) Assignee: Schneider Automation, SAS, Sophia Antipolis (FR)

( * ) Notice: Subject to any disclaimer, the term of this patent is extended or adjusted under 35 U.S.C. 154(b) by 93 days.

(21) Appl. No.: 10/746,487

(22) Filed: Dec. 29, 2003

(65) Prior Publication Data

US 2005/0139791 A1    Jun. 30, 2005

(51) Int. Cl.
*G02B 27/00* (2006.01)
*H01J 40/14* (2006.01)

(52) U.S. Cl. .................. 250/551; 250/214 R
(58) Field of Classification Search .................. 250/551
See application file for complete search history.

(56) References Cited

U.S. PATENT DOCUMENTS 6,388,468 B1 *   5/2002   Li ............................ 326/80

* cited by examiner

*Primary Examiner*—David Porta
*Assistant Examiner*—Suezu Ellis

(57) ABSTRACT

An interface circuit for use between an input circuit and an industrial automation system is disclosed. The industrial automation system includes an opto-coupler capable of being operably connected to the interface circuit. The interface circuit includes a first and second terminal, each terminal capable of being operably connected to the opto-coupler. A first current-source is operably connected to the first terminal and a second current-source is operably connected to the second terminal. A reference voltage is operably connected to the first current-source and the second current-source wherein the first and second current-source cooperate to provide a total input current in accordance with the operating characteristics of the industrial automation circuit.

8 Claims, 2 Drawing Sheets

DUAL CURRENT-SOURCE DIGITAL-INPUT CIRCUIT FOR AN INDUSTRIAL AUTOMATION SYSTEM

The present invention is generally related to industrial automation systems. More specifically, the present invention is related to a dual current-source circuit for an optically isolated digital input circuit utilized in industrial automation systems.

BACKGROUND OF INVENTION

Industrial automation systems generally include input and output circuits. It is desirable that the input circuit operates at high speed and be responsive to various type of signals from the input transducers. It is also beneficial for the industrial automation system to be resilient to operating characteristics of its input circuit and surrounding environment, e.g., electrical noise, that may be potentially adverse to its own operation.

A method to facilitate the industrial automation system's resiliency to these potentially adverse effects of the input circuit is to operably isolate the industrial automation system from the input circuit. One mechanism capable of such functionality is an opto-coupler. It is important to control the amount of current consumed in the circuitry associated with the input opto-isolator.

The amount of current consumed in the industrial automation system during an "on" state is the product of the input current and the input voltage. The input current design point depends on the current-transfer-ratio (CTR) of the opto-coupler. A typical CTR may range from 50 to 600%. In addition, the range of voltage for a discrete input from an IO point also has a broad range. The combination of these two broad ranges of input current and voltage presented to the opto-coupler may be intolerable.

This invention is directed to solving these and other problems.

SUMMARY OF THE INVENTION

The present invention is directed to an interface circuit being operably connected to an optically isolated industrial automation system and an input circuit wherein the interface circuit is operably connected to an opto-coupler of the industrial automation system. The interface circuit includes a first terminal and a second terminal; both terminals are capable of being operably connected to the opto-coupler. A first current-source is operably connected to the first terminal and a second current-source is operably connected to the second terminal. A reference voltage is operably connected to the first current-source and the second current-source. The first and second current-sources are operably connected and cooperate to provide a current in accordance with the operating characteristics of the industrial automation system.

Another aspect of the present invention is an interface circuit being operably connected to an optically isolated industrial automation circuit and an input circuit wherein the interface circuit is operably connected to an opto-coupler of the industrial automation circuit. The interface circuit includes a first and second terminal—both terminals are capable of being operably connected to the opto-coupler. A first transistor is operably connected to the first terminal and a second transistor is operably connected to the second terminal. A reference voltage is operably connected to the first and second transistor. The first and second transistors are operably connected and cooperate to provide an output current in accordance with the operating characteristics of the industrial automation circuit.

A further aspect of the present invention includes a base resistor operably connected between the reference voltage and the base of the first transistor. A first emitter resistor is operably connected to ground and the emitter of the first transistor; and, a second emitter resistor is operably connected to ground and the emitter of the second transistor.

An object of the present invention is to provide a low cost interface circuit for an industrial automation system wherein a first current-source conducts external leakage currents and a second current-source is capable of being independently set for the desired operating characteristics of the industrial automation system.

Another object of the present invention is to provide a mechanism for accurately controlling the amount of current transmitted to the input of an optical coupler used in an industrial automation system.

Yet another object of the present invention is to provide an interface circuit for an industrial automation circuit; the interface circuit having an enhanced EMI/RFI immunity.

A still further object of the present invention is to provide a low cost interface circuit capable of being incorporated with industrial control discreet DC input circuits over a wide range of operational characteristics and speed grades.

Other advantages and aspects of the present invention will become apparent upon reading the following description of the drawings and detailed description of the invention.

DETAILED DESCRIPTION OF PREFERRED EMBODIMENT

Figure 1:
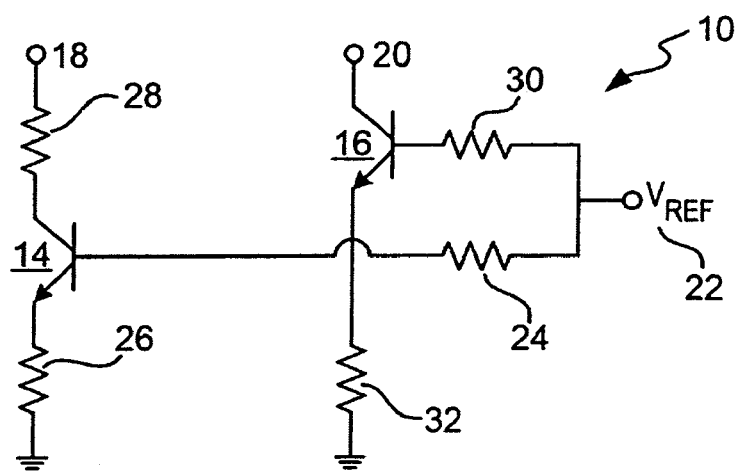
FIG. 1 is a schematic diagram of one embodiment of the present invention.

While this invention is susceptible of embodiments in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

Figure 2:
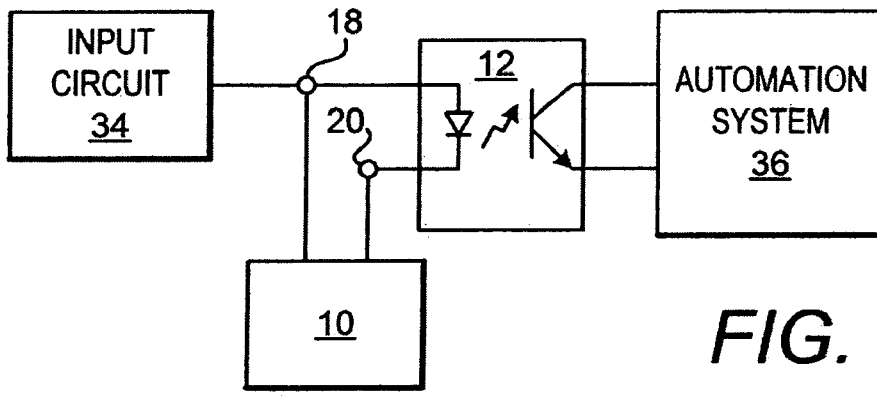
FIG. 2 is a block diagram of the present invention operably connected to an input circuit and an industrial automation system.
Figure 6:
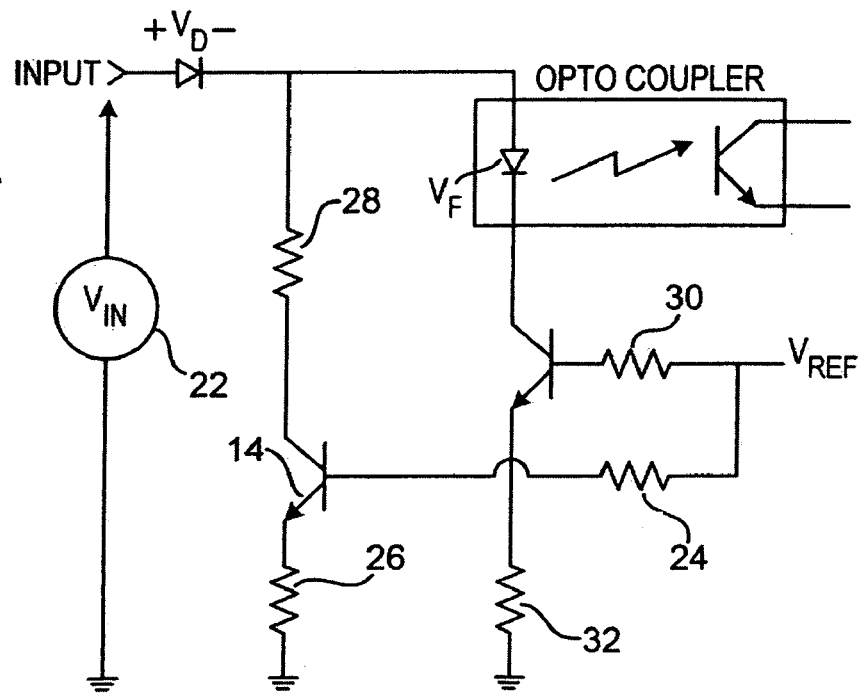

Referring to the drawings in detail, wherein similar reference characters designate corresponding parts throughout the several views, one embodiment of the present invention shown in FIGS. 1, 2, and 6 is an interface circuit 10 for interfacing between an input circuit 34 and an industrial automation system 36. Preferably, the interface circuit 10 is operably connected to the industrial automation system via an opto-coupler 12. The interface circuit 10 includes a first current-source 14 and a second current-source 16. A first 18 and second 20 terminal of the interface circuit 10 are operably connected to the opto-coupler 12, see FIGS. 2 and 6. The first current-source 14 is operably connected to the first terminal 18 and the second current-source 16 is operably connected to the second terminal 20. A reference voltage 22 is operably connected to the first current-source 14 and the second current-source 16. The first current-source 14 is operably connected to the second current-source 16 wherein the first and second current-sources cooperate to provide an output current in accordance with the operating characteristics of the industrial automation circuit.

Preferably, the first and second current-sources 14, 16 are bi-polar transistors. The first current-source 14 includes a base resistor 24, an emitter resistor 26, and a collector resistor 28. The second current-source includes a base resistor 30 and an emitter resistor 32. The collector resistor 28 of the first current-source 14 is connected to the input circuit 34 and the opto-coupler 12. The collector of the second current-source 16 is operably connected to the opto-coupler 12. A generated reference voltage 22 is operably connected through resistors 24 and 30 to each base of the first 14 and second 16 current-sources.

When the base resistor 24 of the first current-source 14 is large, the base current flowing through resistor 24 will lower the voltage seen at the base of the transistor 14. This results in the first current-source 14 being saturated at input voltages approaching zero; thus optimizing EMI immunity due to a low impedance input. In such a configuration, the first current-source 14 is "on" and the second current-source 16 is "off" for input voltages below the "on" threshold ($V_{TH}$). Noise signals will flow through the "on" current-source 14, but not through the "off" current-source 16. A large resistance value for the base resistor 24 of the first current-source 14 also allows for reduced power dissipation in the voltage reference 22 for the "off" state condition because the base current is reduced by the base resister 24.

When the base resistor 30 of the second current-source 16 is small, voltage threshold of the "on" state condition is well controlled, i.e., equal to $V_{REF}-V_{BE}+V_D+V_F$ (assuming $V_{CEsat}$ equals zero volts); as illustrated in FIG. 6. Also, when the base resistor 30 of the second current-source 16 is small, a very small change in input voltage—$V_{IN}$ of FIG. 6—will result in the turning "on" condition. This functionality is desirable because of the fast transition capability with slowly ramping inputs.

Each current-source 14, 16 contributes to an input current signal. Preferably, the first current-source 14 is utilized to provide load current and input impedance reduction for EMI immunity. The second current-source 16 is utilized to determine an active threshold level, and input current to the opto-coupler.

Figure 3:
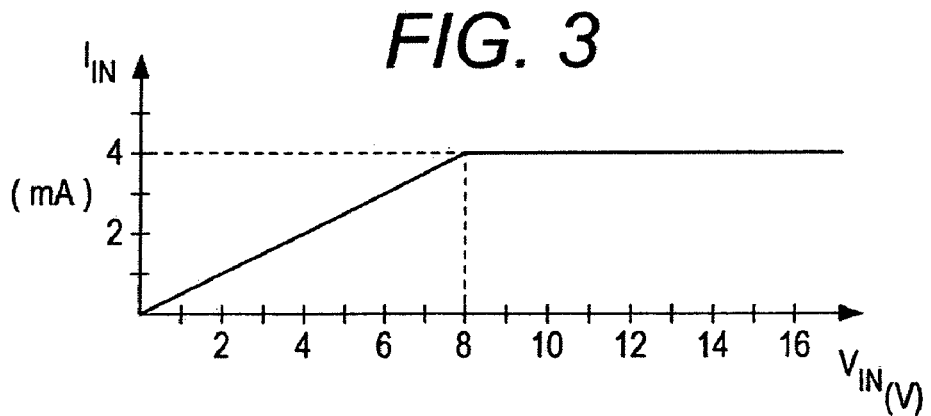
FIG. 3 is a graph of the voltage-current input preferably provided by the first current-source of the present invention.
Figure 4:
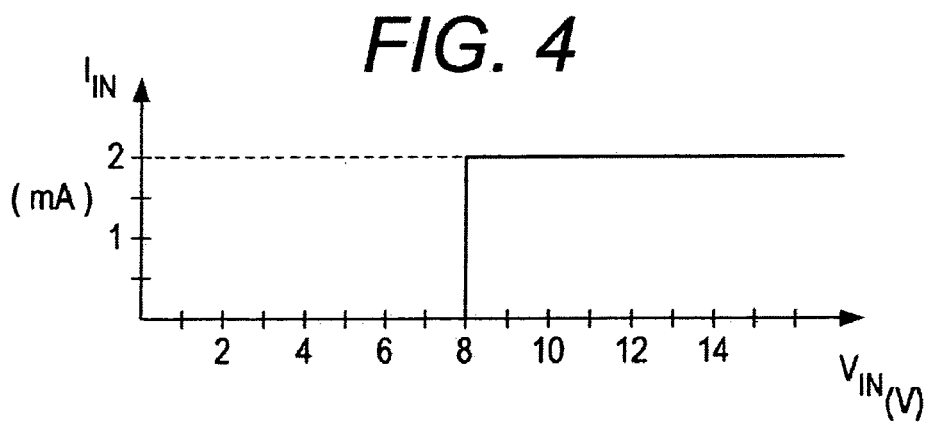
FIG. 4 is a graph of the voltage-current input preferably provided by the second current-source of the present invention.
Figure 5:
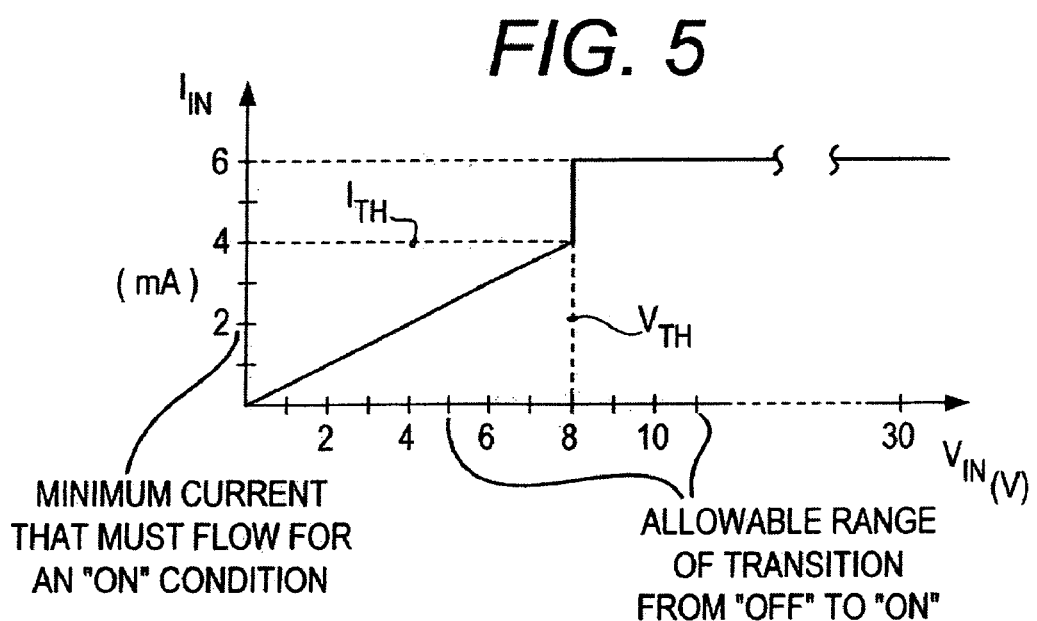
FIG. 5 is a graph of the voltage-current input preferably provided by the interface circuit of present invention; and, FIG. 6 is schematic diagram of another embodiment of the present invention.

Although the present invention is capable of adaptation to various international standard input types, i.e., Type I, Type II, etc., an example is provided for the Type II, 24 volt, application. The preferred voltage range of the voltage generator 22 is 5–11V, and an "on/off" threshold value of 8V. Industrial standards require an amount of current for the "on" condition that must exceed 2 mA; and 6 mA is required if the voltage output is 11V. Incorporating these operating characteristics, a preferred voltage-current (VI) plot for the first current-source 14 is shown in FIG. 3; and a preferred VI plot for the second current-source 16 is shown in FIG. 4. Utilizing both VI plots of FIGS. 3 and 4, a composite VI plot of the interface circuit 10 is shown in FIG. 5. The maximum amount of current allowed to flow through the opto-coupler 12 is limited to a maximum of 2 mA. Limiting the total input current flow to 6 mA will guard against excessive heating of the circuit 10.

It can be readily seen that the current combination of both current-sources 14, 16 during the "on" condition of the circuit, i.e., beyond the 8V threshold level, will combine to reach 6 mA. This current level is required for Type II standard inputs.

For exemplification purposes, the operating characteristics of the composite VI plot of the interface circuit 10 shown in FIG. 5 are utilized to select several values for the circuit's resistive elements. To determine the base resistor 24 of the first current-source, a forced $h_{fe}$ of 10 may be assumed. For a collector current $I_{C1}$, maximum of 4 mA, (see FIG. 3), $I_{B1}$ is 0.4 mA, i.e., $I_{B1}=I_{C1}/10$, then $R_{24}=(V_{REF}-V_{BE})/0.4$ mA. Due to the characteristics we would like to achieve i.e., a very steep slope in FIG. 4 at 8 volts, the base resistor 30 of the second current-source 16 is much less than the base resistor 24 of the first current-source, e.g., 0 ohms.

To determine the threshold voltage, the following equation can be utilized, $V_{TH}=V_{REF}-V_{BE}+V_D+V_F$. Assuming $V_{BE}=V_D$, we determine that $V_{REF}$ equals 6.3V when $V_F$ is 1.7 volts.

Since the base resistor 24 of the fast current-source 14 is equal to $(V_{REF}-V_{BE})/I_B$, we find the base resistor of the first current-source equals 14 Kohms ((6.3V–0.7V)/0.4 mA=14K ohms).

Because it is desired to implement 4 mA at saturation of the first current-source 14, the value of the emitter resistor 26 for the first current-source can be determined by (6.3V–0.7V)/4 mA, which equals 1.40 Kohms.

To ensure at least 6 mA of required current is drawn from the input 34, 2 mA of current is required from the second current-source 16 to combine with the 4 mA of current provided by the first current-source 14. The value of the emitter resistor 32 for the second current-source 16 can be determined by (6.3V –0.7V)/2 mA, which equals 2.80 Kohms.

In this configuration, the first collect resistor 28 is utilized to reduce power in the first current-source 14. Logically, the value of the first collect resistor 28 can be set to zero, as long as the power in the first current-source 14 is below its thermal problem area. A higher value for the first collector resistor 28 can be selected as long as 4 mA of current flow is ensured at an 11V input for $V_{IN}$. Thus, the high limit of first collector resistor 28 is equal to (11V–0.7V–5.6V)/4 mA, which equals 1.175 Kohms; a value of 1 Kohm can be utilized for the first collector resistor 28

In summary, for a Type II input having a voltage threshold of 8V, the values for the resistive elements utilized in the interface circuit 10 shown in FIG. 1 are: the first base resistor 24 is 14 Kohms, the second base resistor 30 is 0 ohm, the first emitter resistor 26 of the first current-source 14 is 1.40 Kohms, the first emitter resistor 26 of the second current-source 16 is 2.80 Kohms, and the first collector resistor 28 of the first current-source 14 is within the range of 0–1.0 Kohms.

Assuming the first collector resistor 28 is zero, the current threshold value, $I_{TH}$ is equal to or greater than 4.0 mA; see FIG. 5. Depending on the current-transfer-ratio and the collect load resistor of the opto-coupler 12, the 4 mA–2 mA split in the example provided above is selected based on the needs of a high-speed option utilizing a model PC257 opto-coupler with anti-saturation characteristics.

Although it is preferable to utilize unequal characteristics for the first and second current-sources 14,16, it is to be understood that other splits of current-flow between the first and second current-sources can be easily designed by one of ordinary skill in the art, i.e., 3 mA and 3 mA, and is to be considered within the scope of the present invention.

While the specific embodiment has been illustrated and described, numerous modifications come to mind without significantly departing from the spirit of the invention, and the scope of protection is only limited by the scope of the accompanying claims.

I claim:

1. An interface circuit comprising:
   a first terminal capable of being operably connected to an opto-coupler;
   a second terminal capable of being operably connected to the opto-coupler;
   a first current-source being operably connected to the first terminal;
   a second current-source being operably connected to the second terminal; and,
   a reference voltage being operably connected to the first current-source and the second current-source, the first current-source being operably connected to the second current-source wherein the first and second current-source cooperate to provide a total input current in accordance with a set of operating characteristics for an industrial automation system, wherein the opto-coupler is operably connected to the industrial automation system.

2. The interface circuit of claim 1 further comprising:
   a base resistor being operably connected between the reference voltage and the first current-source.

3. An interface circuit being operably connected to an opto-isolated industrial automation system and an input circuit wherein the interface circuit being operably connected to an opto-coupler of the industrial automation system, the interface circuit comprising:
   a first terminal capable of being operably connected to the opto-coupler;
   a second terminal capable of being operably connected to the opto-coupler;
   a first current-source being operably connected to the first terminal;
   a second current-source being operably connected to the second terminal;
   a reference voltage being operably connected to the first current-source and the second current-source, the first current-source being operably connected to the second current-source wherein the first and second current-source cooperate to provide a total input current in accordance with a set of operating characteristics for the industrial automation system;
   a first emitter resistor being operably connected to ground and the first current-source; and,
   a second emitter resistor being operably connected to ground and the second current-source.

4. An interface circuit comprising:
   a first terminal capable of being operably connected to an opto-coupler;
   a second terminal capable of being operably connected to the opto-coupler;
   a first transistor being operably connected to the first terminal;
   a second transistor being operably connected to the second terminal; and,
   a reference voltage being operably connected to the first transistor and the second transistor, the first transistor being operably connected to the second transistor wherein the first and second transistor cooperate to provide a total input current in accordance with a set of operating characteristics for an industrial automation system, wherein the opto-coupler is operably connected to the industrial automation system.

5. An interface circuit being operably connected to an opto-isolated industrial automation system and an input circuit wherein the interface circuit being operably connected to an opto-coupler of the industrial automation system, the interface circuit comprising:
   a first terminal capable of being operably connected to the opto-coupler;
   a second terminal capable of being operably connected to the opto-coupler;
   a first transistor being operably connected to the first terminal;
   a second transistor being operably connected to the second terminal;
   a reference voltage being operably connected to the first transistor and the second transistor, the first transistor being operably connected to the second transistor wherein the first and second transistor cooperate to provide a total input current in accordance with the operating characteristics of the industrial automation system;
   a first base resistor being operably connected between the reference voltage and the base of the first transistor; and,
   a second base resistor being operably connected between the reference voltage and the base of the second transistor.

6. An interface circuit being operably connected to an opto-isolated industrial automation system and an input circuit wherein the interface circuit being operably connected to an opto-coupler of the industrial automation system, the interface circuit comprising:
   a first terminal capable of being operably connected to the opto-coupler;
   a second terminal capable of being operably connected to the opto-coupler;
   a first transistor being operably connected to the first terminal;
   a second transistor being operably connected to the second terminal;
   a reference voltage being operably connected to the first transistor and the second transistor, the first transistor being operably connected to the second transistor wherein the first and second transistor cooperate to provide a total input current in accordance with the operating characteristics of the industrial automation system;
   a first emitter resistor being operably connected to ground and the first transistor; and,
   a second emitter resistor being operably connected to ground and the second transistor.

7. The interface circuit of claim 6 further comprising:
   a first current-source further comprising:
      a base being operably connected to a first base resistor and the reference voltage;
      an emitter being operably connected to ground via the first emitter resistor; and,
      a collector being operably connected to the input circuit via a collector resistor; and,
   a second current-source further comprising:
      a base being operably connected to a second base resistor and the reference voltage, the second base resistor having a resistance value substantially less than the first base resistor;

an emitter being operably connected to ground via the second emitter resistor; and, a collector being operably connected to the opto-coupler, wherein the first current-source provides load current to the industrial automation system and reduces input impedance, thus reducing adverse effects due to electro-magnetic induction and the second current-source provides an on/off threshold level.

8. For an interface circuit being operably coupled between an input circuit and an industrial automation system, the interface circuit including a first and second current-source cooperating to regulate an input signal to an opto-coupler of the industrial automation system, wherein the first current source is capable of providing a load current and reducing input impedance, and the second current source is capable of regulating an output signal, a method for providing the input signal to the industrial automation system, the method comprising the steps of:

providing a voltage reference level;

receiving an input signal from the input circuit;

generating a first output signal in response to the received input signal, the first output signal including a first output current signal, the first output current signal being constant above a voltage input threshold level;

generating a second output signal in response to the received input signal, the second output signal including a second output current signal, the second output current signal being based on a first value below the voltage input threshold level and a second value above the voltage input threshold level; and, transmitting the output signal to the industrial automation system via an opto-coupler operably coupled to the industrial automation system, the output signal including the first output current signal and the second output current signal.

* * * * *